US005294849A

United States Patent [19]

Potter

[11] Patent Number: 5,294,849

[45] Date of Patent: Mar. 15, 1994

[54] REFLEXIVE CIRCUIT

[76] Inventor: Bronson Potter, R.F.D. 1, Greenville, N.H. 03048

[21] Appl. No.: 873,649

[22] Filed: Apr. 23, 1992

Related U.S. Application Data

[63] Continuation of Ser. No. 762,070, Sep. 18, 1991, abandoned, which is a continuation of Ser. No. 789,631, Oct. 21, 1985, abandoned, which is a continuation-in-part of Ser. No. 550,293, Nov. 9, 1983, abandoned, which is a continuation-in-part of Ser. No. 470,913, Mar. 1, 1983, abandoned, which is a continuation-in-part of Ser. No. 372,978, Apr. 29, 1982, abandoned.

[51] Int. Cl.[5] .......... H03K 17/13; H03K 17/51

[52] U.S. Cl. .......... 307/647; 307/639; 307/643; 307/632

[58] Field of Search .......... 315/DIG. 4, 194, DIG. 5, 315/199, 209, 205, 206, 207, 306, 66, 73, 156, 705, 291, 360; 307/146, 141, 140, 253, 254, 632, 639, 647, 643, 642, 638; 361/58, 18, 56, 57

[56] References Cited

U.S. PATENT DOCUMENTS

| | | | |
|---|---|---|---|
| 2,776,420 | 1/1957 | Woll | 340/252 |
| 2,863,692 | 12/1960 | Barter et al. | 340/251 |
| 3,061,744 | 10/1962 | Spira | 307/146 |
| 3,227,920 | 1/1966 | Peek, Jr. et al. | 315/66 |
| 3,234,342 | 2/1966 | Murray | 200/51 |
| 3,517,211 | 6/1970 | Firth | 307/225 |
| 3,558,912 | 1/1971 | Spall | 315/306 |
| 3,619,658 | 11/1971 | Prunty | 307/255 |
| 3,665,212 | 5/1972 | Roberts et al. | 307/647 |
| 3,721,832 | 3/1973 | Lee | 307/141 |
| 3,733,528 | 5/1973 | Gilbreath | 315/291 |
| 3,870,903 | 3/1975 | Taylor | 307/252 |
| 3,898,516 | 8/1975 | Nakasone | 315/194 |
| 3,916,249 | 10/1975 | Ackerman | 315/73 |
| 3,935,482 | 1/1976 | Fox, Jr. et al. | 307/647 |
| 3,940,660 | 2/1976 | Edwards | 315/360 |
| 3,991,343 | 11/1976 | Delpy | 315/194 |
| 4,082,961 | 4/1978 | Genuit | 315/194 |
| 4,087,702 | 5/1978 | Kirby et al. | 307/252 |
| 4,090,107 | 5/1978 | Seib | 315/156 |
| 4,097,782 | 6/1978 | Chambliss | 315/194 |
| 4,144,478 | 3/1979 | Nuver | 315/291 |
| 4,152,608 | 5/1979 | Nakasone et al. | 315/194 |
| 4,155,015 | 5/1979 | Nakasone et al. | 307/252 |
| 4,158,150 | 6/1979 | Dever | 307/647 |
| 4,160,192 | 7/1979 | McAllise | 315/194 |
| 4,245,166 | 1/1981 | Rankin | 307/632 |
| 4,249,089 | 2/1981 | Wolford et al. | 307/140 |
| 4,274,034 | 6/1981 | Conklin | 315/240 |
| 4,350,903 | 9/1982 | Uimerson et al. | 315/194 |
| 4,358,716 | 11/1982 | Cordes et al. | 315/306 |
| 4,371,812 | 2/1983 | Widmayer | 315/205 |

FOREIGN PATENT DOCUMENTS

| | | |
|---|---|---|
| 0053896 | 6/1982 | European Pat. Off. . |
| 0093408 | 11/1983 | European Pat. Off. . |

*Primary Examiner*—William L. Sikes
*Assistant Examiner*—Toan Tran
*Attorney, Agent, or Firm*—Fish & Richardson

[57] ABSTRACT

A two-terminal device for connection by its two terminals into an electrical circuit having a power source or signal connected to an electrical load or signal receiver and a means for causing selected brief interruptions of the circuit, comprising an electronic reflex element connected to receive power or a signal from the source via the two terminals and to change from a first state to a second state in response to the interruptions, the state change being dependent on the brevity of the interruptions, the reflex element including a control element connected to prevent power or a signal from reaching the load or signal receiver when the reflex element is in a particular one of the states and the circuit is not being interrupted.

18 Claims, 8 Drawing Sheets

REFLEXIVE CIRCUIT

This is a continuation of application Ser. No. 07/762,070, filed Sep. 18, 1991, now abandoned, Ser. No. 06/789,631, filed Oct. 21, 1985, now abandoned, Ser. No. 06/550,293, filed Nov. 9, 1983, now abandoned, Ser. No. 06/470,913, filed Mar. 1, 1983, now abandoned, and Ser. No. 06/372,978 filed Apr. 29, 1992, now abandoned.

BACKGROUND OF THE INVENTION

This invention relates to controlling the delivery of power or a signal from a source to a load in an electrical circuit.

SUMMARY OF THE INVENTION

The invention features, in one broad aspect, a two-terminal device which can be connected by its two terminals into such an electrical circuit having means for causing selected brief interruptions in the circuit, the device including an electronic reflex element which receives power or a signal from the source via the two terminals and which changes from a first to a second state in response to the interruptions, the state change being dependent on the brevity of the interruptions. The reflex element includes a control element connected to prevent power or a signal from reaching the load or a signal receiver when the reflex element is in a particular one of the states and the circuit is not being interrupted.

In another aspect, the invention features a two-terminal reflexive device which includes a two-state element which receives power or a signal from the source via the two terminals and reflexively responds to each selected brief circuit interruption by changing from the electrical state it occupied before the interruption to its other electrical state. The two-state element includes a control element which enables power or a signal to reach the load or a signal receiver when the two-state element is in one state and the circuit is not being interrupted, or prevents power or a signal from reaching the load or a signal receiver when the two-state element is in the other state and the circuit is not being interrupted.

The device is inexpensive, simple, and can be connected into a wide variety of electrical circuits to reflexively control the delivery of power or a signal by selective brief interruptions in the connection between the source and the load. Because the circuit interruptions can be accomplished anywhere in the circuit, the device can be located remotely from the means for interruption. The circuit is reflexive in that even when there is no interruption in the circuit, the load may not be powered, depending on the state of the two-state element.

In another aspect, the invention features a two-terminal logic circuit element having a first terminal for receiving input binary signals, a second terminal for delivering output binary signals (the binary signals having either a non-zero DC voltage level or a zero level), and a two-state element whose state depends on the zero level signals appearing at the input terminal. The two-state element includes a control element which delivers a zero level output signal when the two-state element is in one state, and a non-zero level output signal when the two-state element is in the other state.

The device in this aspect can serve as a logic circuitry element whose output is a sequence of non-zero and zero level signals, the non-zero output signal appearing every other time a non-zero input signal is received. The device has only two terminals and does not require a separate triggering terminal.

In yet another aspect, the invention features a two-terminal device for connection into a DC powered electrical circuit in which there is an "on", "off" switch for selectively briefly interrupting the connection between the source and the load, and the two-state element includes a control element that enables or prevents powering of the load in response to circuit interruptions no shorter than about one millisecond.

The device in this aspect can be used to reflexively control delivery of DC power to a load based on interruptions occurring with the speed typical of toggling a switch.

In yet another aspect, the device is for connection into an AC-powered circuit and the two-state element includes a control element that enables or prevents full-wave powering of the load in response to circuit interruptions no shorter than about one millisecond.

The device in this aspect allows reflexive switch control of a load powered by conventional line current.

In preferred embodiments, the two-state element includes a switchable electronic component, preferably a transistor, capable of selectively passing current or blocking current, the switchable component and the control element being connected so that in one state of the two-state element, the switchable component is passing current and the control element is preventing power or a signal from reaching the load or signal receiver, and in the other state the switchable component is blocking current and the control element is enabling power or a signal to reach the load or signal receiver, whereby the two-state element is made simple and economical; the two-state element further includes a fading memory electrical component (preferably a capacitor) whose condition determines the state of the two-state element, the fading memory component being arranged to be in a first condition when the power or signal is being prevented from reaching the load or signal receiver, and to fade from the first condition to a second condition in a predetermined period of time during the next interruption, whereby if the next interruption is shorter than the predetermined period, power or the signal is enabled to reach the load or signal receiver after the next interruption ends, whereby different lengths of interruptions can be used to effect different load control sequences; the control element comprises a pair of transistors connected in a positive-feedback configuration (whereby the circuit is latched into the on state) or a single transistor (whereby the circuit is made fast and simple) or a silicon-controlled rectifier, (whereby the circuit is made inexpensive); the device may also include a full-wave bridge rectifier connected between the electrical circuit and the two-state element, whereby full-wave power is enabled to reach the load, and the control element includes a thyristor component; the control element includes a TRIAC; and the means for causing temporary interruptions includes a series of normally closed momentary contact switches, or a series of three-way switches with both poles of each switch connected together, whereby commonly available switches can be used to control the circuit from each one of several locations and each switch is typically in a condition which permits power to flow to the reflex circuit.

Other features and advantages will be apparent from the description of the preferred embodiment, and from the claims.

DESCRIPTION OF PREFERRED EMBODIMENTS

We first briefly describe the drawings.

DRAWINGS

Structure and Operation

Figure 1:
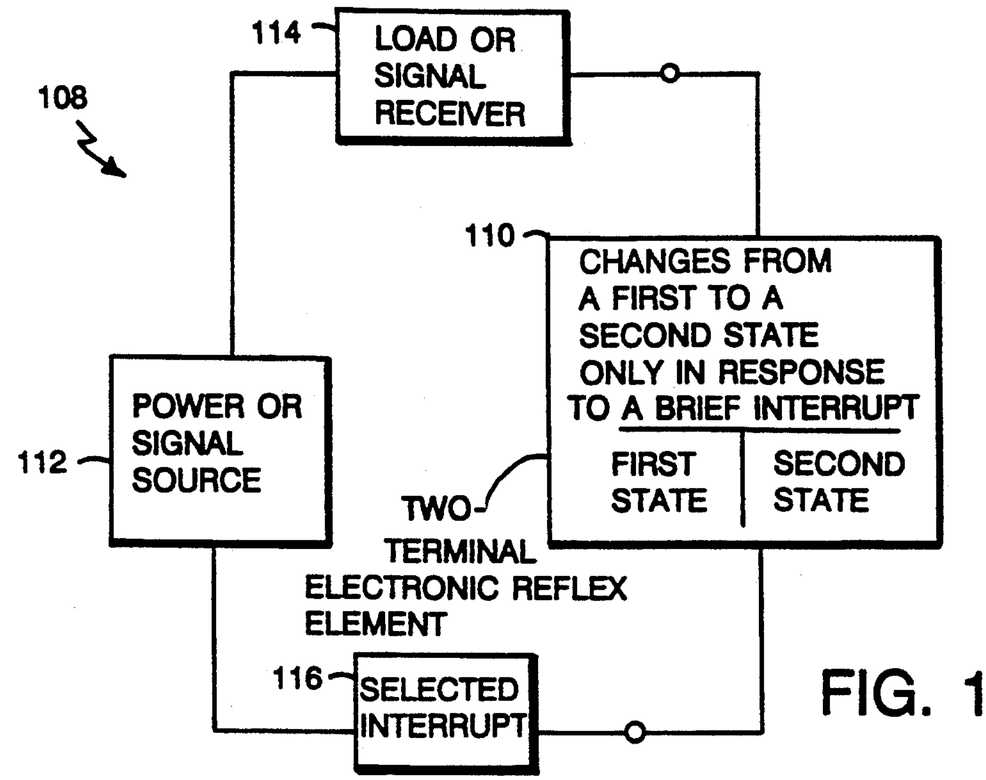
FIG. 1 is a diagram of a circuit including the two-terminal reflexive device of the invention.

Referring to FIG. 1, two-terminal device 110 is connected by its two terminals into an electrical circuit 108 including power source 112 (which could be a signal source), load 114 (which could be a signal receiver), and selective brief interruption means 116. The two-terminal device 110 has a two-state electronic reflex element which receives power or a signal from the source via the two terminals and responds to each interruption caused by the interruption means 116 by changing from the electrical state it occupied before the interruption to its other electrical state. Device 110 enables power or a signal to reach the load when it is in one state and the circuit is not being interrupted, and prevents power or a signal from reading the load when it is in the other state and the circuit is not being interrupted.

Figure 2:
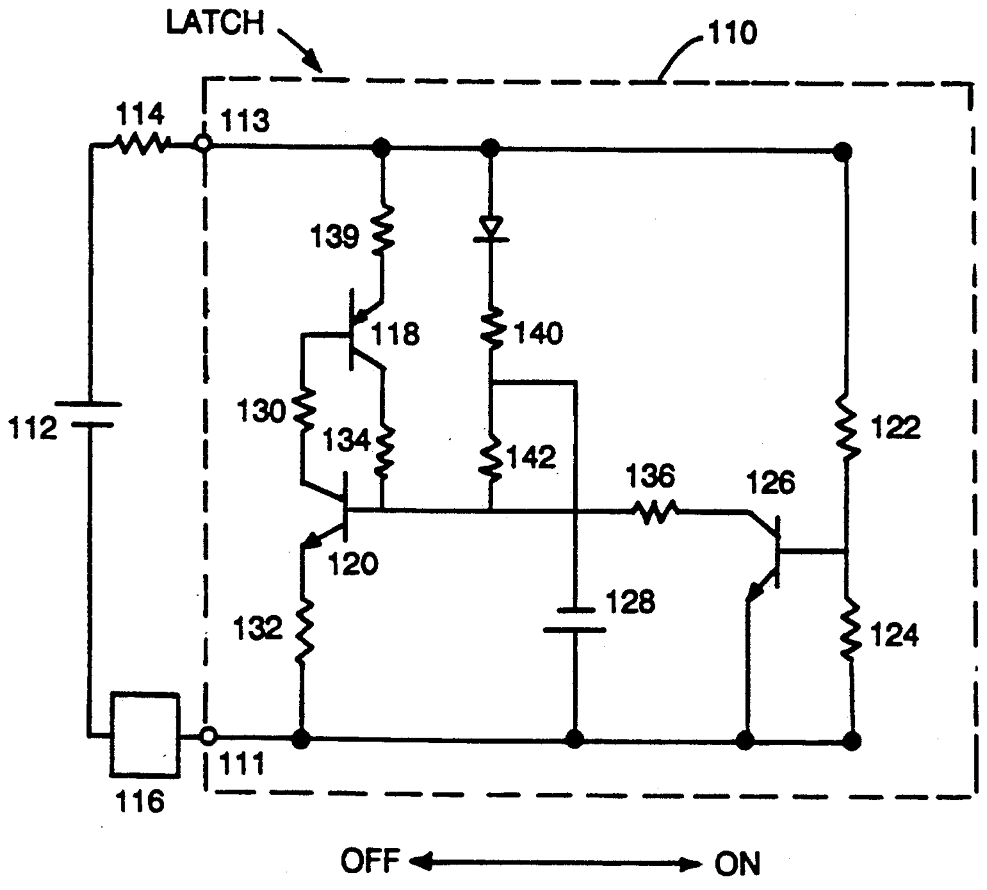
FIG. 2 is a circuit diagram of a preferred embodiment of a DC-driven reflexive circuit employing a PNPN combination.

Referring to FIG. 2, two-terminal reflex circuit 110 is connected by its two terminals 111, 113 in series in an electrical circuit having a DC source 112, a load 114, and a circuit interruption device 116. Circuit 110 is suitable for implementation in the form of an integrated circuit. Transistors 118, 120 form a PNPN combination which by operation of positive feedback between the collectors and bases of the transistors keeps the PNPN combination latched on, once it has been triggered on. Circuit interruption device 116 is capable of passing very brief pulses of current or signals to circuit 110, the pulses being separated by very brief intervals. When circuit interruption device 116 sends a pulse, current flowing through resistors 122, 124 switches transistor 126 on before capacitor 128 (50 picofarads) has charged sufficiently to turn on the PNPN combination. Once on, transistor 126 conducts sufficient current to prevent the PNPN combination from subsequently switching on. No voltage appears across load 114 because the entire voltage drop occurs in circuit 110. If the circuit is temporarily interrupted between pulses very briefly before capacitor 128 has had time to discharge, the voltage at the base of transistor 120 generated by charged capacitor 128 will switch on the PNPN combination and the DC power will flow through load 114 and the PNPN combination. Transistor 126 will remain off, and capacitor 128 will discharge. Thereafter, interrupting the circuit temporarily by a brief interval between pulses effected by circuit interruption device 116 will switch on transistor 126. Resistors 130, 132, 134, 136, 139 are included to prevent saturation of the circuit. Appropriate values of the components are as follows:

| Component | Value |
|---|---|
| source 112 | 5 to 12 volts DC |
| resistor 122 | 6.8 K ohms |
| resistor 124 | 1.2 K ohms |
| capacitor 128 | 50 picofarads |
| resistor 130 | 1.2 K ohms |
| resistor 132 | 100 ohms |
| resistor 134 | 1.2 K ohms |
| resistor 136 | 510 ohms |
| resistor 139 | 100 ohms |
| resistor 140 | 6.8 K ohms |
| resistor 142 | 6.8 K ohms |

All component values disclosed herein are approximate.

The circuit of FIG. 2 thus provides an inexpensive two-state reflex circuit enabling the load to be powered only on every other interruption of the power at its two terminals 111, 113, and is suited for use with a circuit interruption device 116 capable of delivering pulses at higher frequencies (e.g. higher than 1 kilocycle). Thus, circuit 110 could be useful as a high-speed two-terminal multivibrator for computer applications, in which the circuit interruption device 116 would have logic circuitry for delivering a succession of logic signals, some at zero voltage level, and the load 114 would correspond to logic circuitry to which the logical signals from the multivibrator would be delivered. Input binary signals could be delivered at terminal 111 and output binary signals at terminal 113. Unlike conventional multivibrators, no separate triggering terminal is needed.

Figure 3:
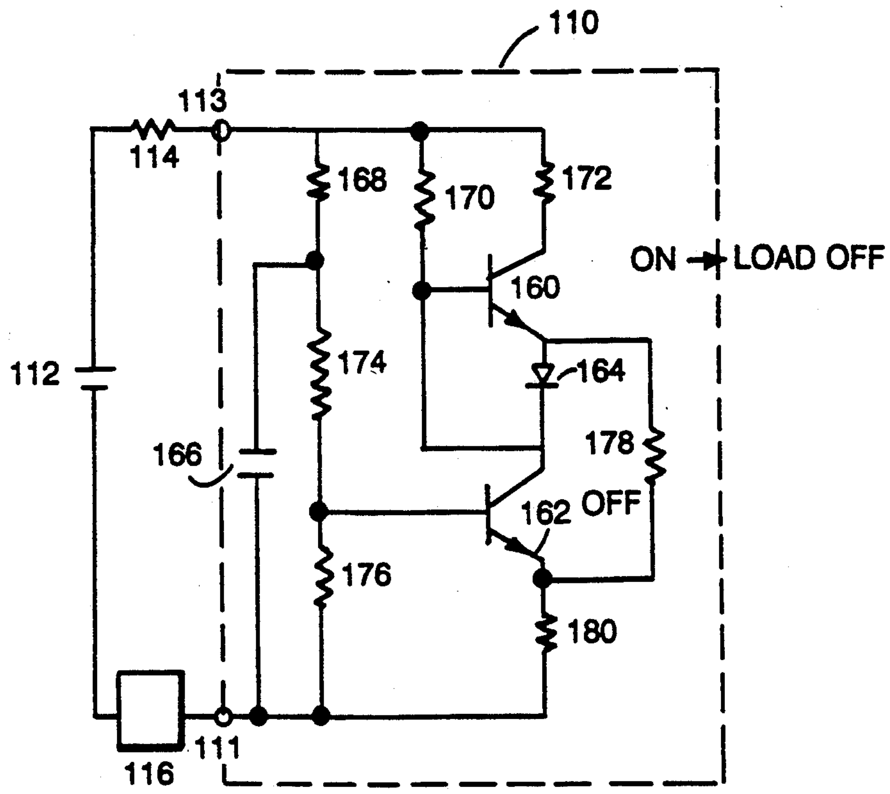
FIG. 3 is a circuit diagram of an alternate DC-driven embodiment employing only two transistors.

Referring to FIG. 3, in another embodiment, transistors 160, 162 are coupled by diode 164. One and only one of the transistors is switched on whenever circuit interruption device 116 interrupts the power. When power is first applied, transistor 160 switches on before capacitor 166 can charge up sufficiently to switch transistor 162 on. If the circuit power is interrupted briefly, then when power is connected again capacitor 166 causes transistor 162 to switch on. When transistor 160 is on, the load is not powered; when transistor 162 is on, the load is powered. The circuit is capable of switching 5 milliamps of current from a 5-volt source 112. Resistors 168, 170, 172, 178 and 180 are selected to prevent saturation.

Appropriate values for the components are as follows:

| Component | Value |
|---|---|
| capacitor 166 | 50 picofarads |
| resistor 168 | 12 K ohms |
| resistor 170 | 12 K ohms |
| resistor 172 | 100 ohms |
| resistor 174 | 12 K ohms |
| resistor 176 | 50 ohms |
| resistor 178 | 1.2 ohms |
| resistor 180 | 100 ohms |

Figure 4:
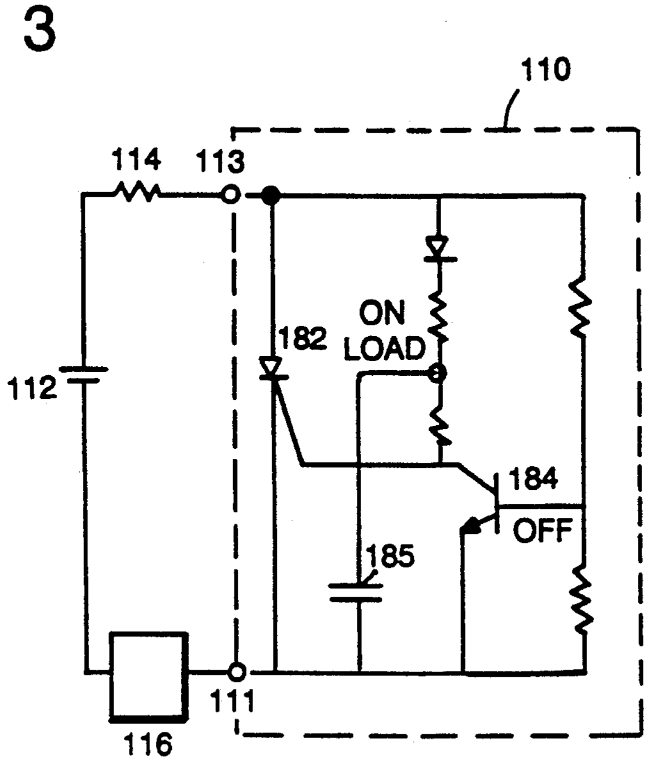
FIG. 4 is a circuit diagram of an alternate DC-driven embodiment in which the PNPN combination of FIG. 2 is replaced by a silicon-controlled rectifier.

Referring to FIG. 4, in a circuit similar to but slower switching than the circuit of FIG. 2, SCR 182 (which has a switching speed on the order of 1 millisecond) is substituted for the PNPN combination. When the SCR is on, the load 114 is powered. When transistor 184 is on, the load is not powered. Circuit interruption device 116 in this case is an "on", "off" switch (for example, a normally closed momentary contact switch) which can be switched off briefly, i.e., for a period shorter than the decay period of capacitor 185.

Figure 5:
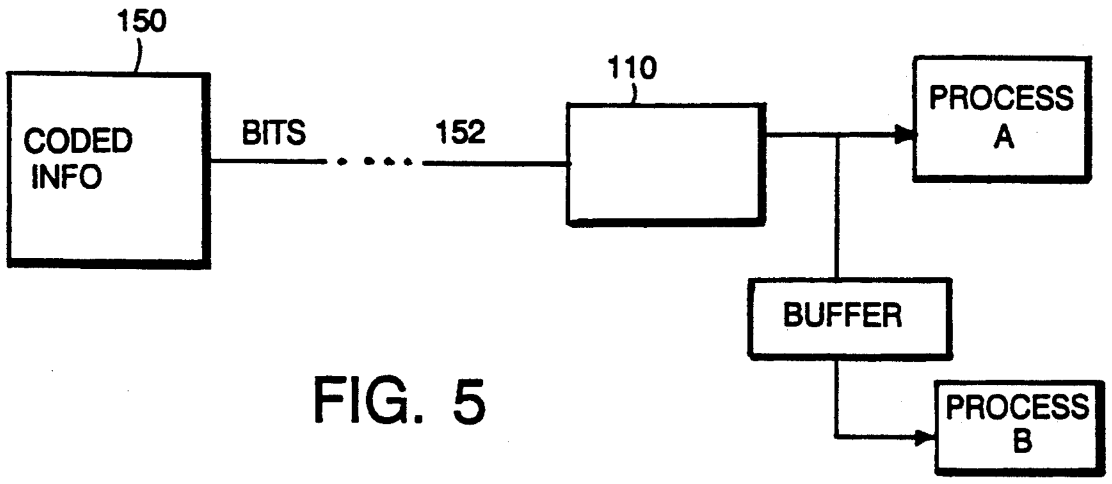
FIG. 5 is a block diagram of a process control system including a reflexive circuit according to the invention.

Referring to FIG. 5, in one application of the higher speed reflex circuit 110 of FIGS. 2 and 3, coded information 150 could be sent as a stream of binary signals over control line 152 to a remote reflex circuit 110 and the resulting sequence of output currents could trigger either process A or process B as desired depending on the sequence of binary signals sent over line 152.

Figure 6:
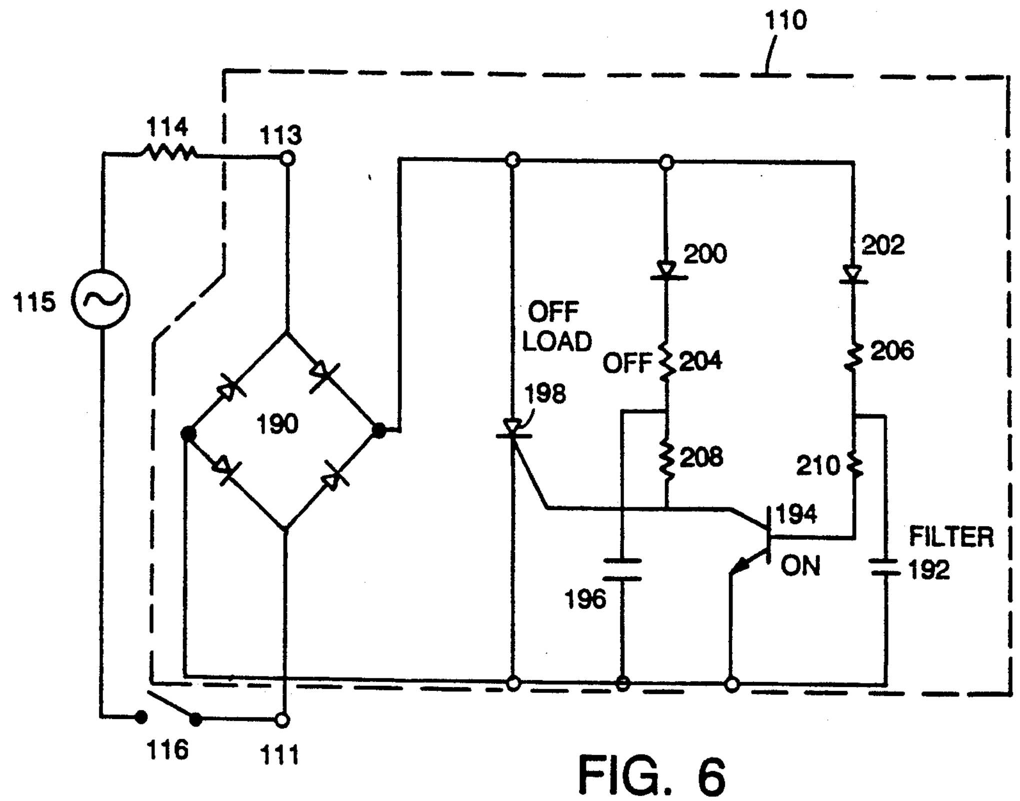
FIG. 6 is a block diagram of an AC-driven embodiment using a silicon-controlled rectifier and a full-wave bridge rectifier.

Referring to FIG. 6, in a slower speed embodiment suitable for use in a 120-volt AC circuit a full wave bridge rectifier 190 rectifies AC current from source 115 and delivers the resulting unfiltered DC current to the remainder of reflex switch circuit 110. Capacitor 192 smooths and filters the DC current so that when power is first applied by closing switch 116, transistor 194 turns on and stays on before capacitor 196 has charged up enough to throw SCR 198 on. With transistor 194 on, load 114 (e.g., an electric lamp) is not powered. If switch 116 is turned off briefly and turned on again (before capacitor 196 has time to discharge) SCR 198 is immediately switched on and latches on, allowing full wave power to reach load 114 via rectifier 190. Thus, load 114 receives full power every other time the switch is thrown on. Suitable component values are as follows:

| Component | Value |
|---|---|
| rectifier 190 | 600 PIV, 5 amp |
| resistors 206, 210 | 50 K ohms |
| resistors 204, 208 | 4.7 K ohms |
| capacitor 192 | 0.1 microfarad |
| capacitor 196 | 10 microfarads |

Figure 7:
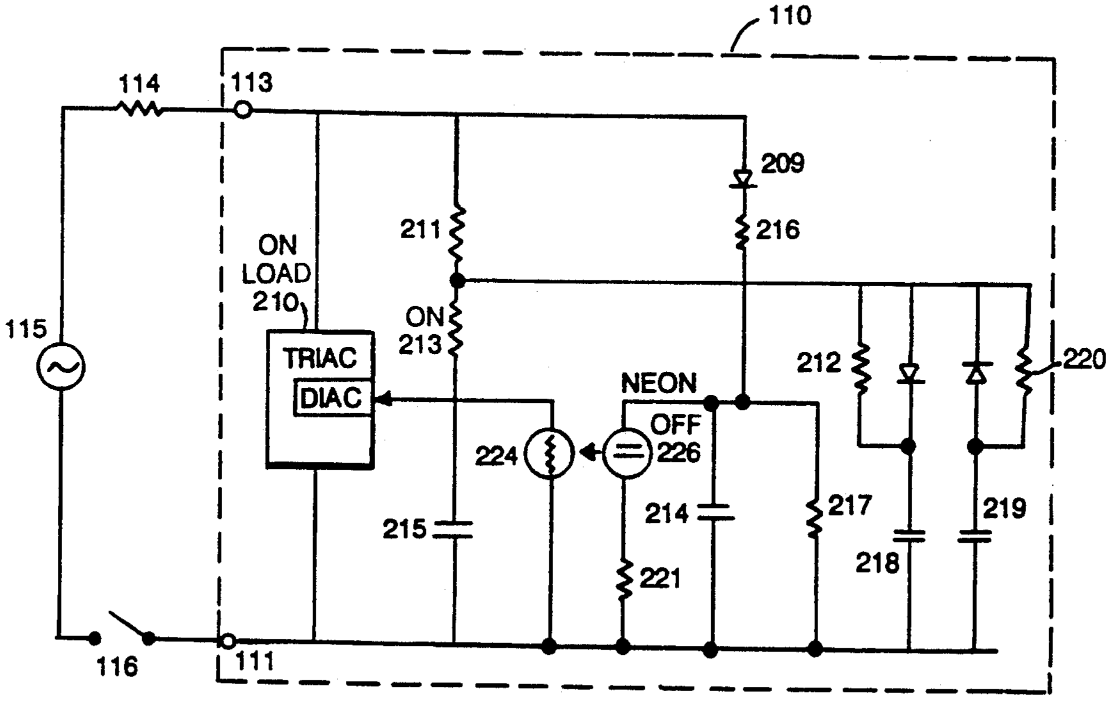
FIG. 7 is a block diagram of an AC-driven embodiment using a TRIAC and a neon/photocell combination.

Referring to FIG. 7, inexpensive and commonly available TRIACs can be used to implement a slower speed, AC-driven reflex circuit. When lamp 114 is first powered, there is insufficient voltage drop across TRIAC/DIAC 210 to light neon bulb 226 (which has a relatively high threshold starting voltage, e.g. more than 30 volts) through the charging circuit of diode 209 and resistor 216, the voltage across capacitor 214 being about 30 volts. With neon bulb 226 dark, photocell 214 has a high resistance allowing capacitor 215 to charge which fires TRIAC/DIAC 210. Lamp 114 remains powered until switch 116 is toggled off, which allows capacitors 218, 219 to discharge sufficiently so that when switch 116 is again thrown on, the delay which occurs before capacitors 218, 219 recharge allows neon 226 to turn on. Photocell 224 then receives the light from neon 226 and has low resistance which keeps the TRIAC/DIAC 210 from firing and lamp 114 is not illuminated. Capacitors 218 and 219 then charge sufficiently so that on the next brief toggling of switch 116, neon 226 does not go on and lamp 114 is powered.

Suitable component values are:

| Component | Value |
|---|---|
| neon 226 | NE-2 |
| resistor 216 | 4.7 K ohms |
| resistor 211 | 4.7 K ohms |
| resistor 213 | 4.7 K ohms |
| resistors 212, 220 | 5 Megohms |
| capacitors 218, 219 | 2 microfarads, 100 volts |
| resistor 217 | 1 Megohm |
| capacitor 214 | 0.1 microfarad, 100 volts |
| capacitor 215 | 0.1 microfarad, 50 volts |
| resistor 221 | 100 K ohms |
| load 114 | 50-550 watts |

Figure 8:
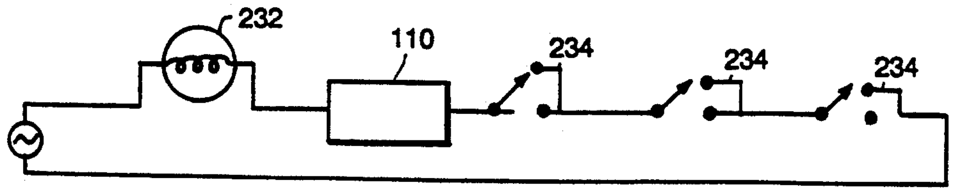
FIG. 8 is a block diagram of a lamp controlled from several switches using an AC-driven reflexive circuit.

Referring to FIG. 8, in one application of the reflex switch 110 of FIGS. 6 and 7 the reflex switch is connected into a circuit in series with a lamp 232 and several conventional three-way switches 234, each of which has both poles wired together. The interruption of the circuit required to throw circuit 110 to its other state is accomplished simply by throwing any of the three-way switches. Thus, a lamp can be controlled from any one of several switches using a simple two-wire connection. The switches could alternatively be normally closed switches.

Figure 9:
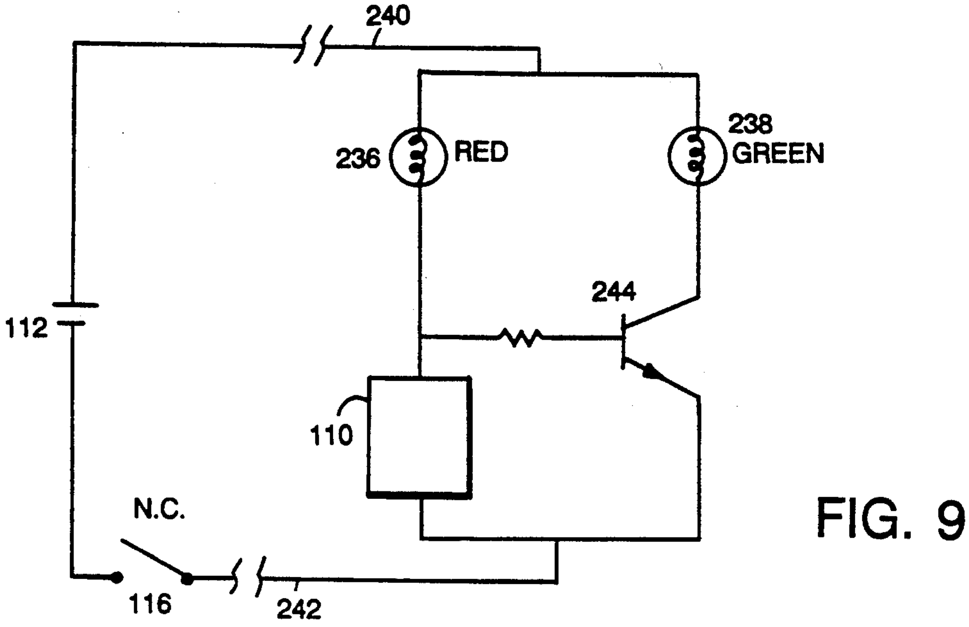
FIG. 9 is a circuit diagram of a pair of traffic lamps controlled by a normally closed switch and a DC-driven reflexive circuit.

Referring to FIG. 9, in one application of a DC-powered reflex circuit, circuit 110 is connected so that the load includes two traffic signaling lamps 236, 238, one red and one green. Battery 112 and switch 216 are located remotely from the load and connected by two wires 240, 242. By an appropriate series of circuit interruptions effected by normally closed switch 116, circuit 110 can be switched between its two states and transistor 244 can be switched on or off, thus allowing a police officer to control traffic remotely by selectively lighting either the red or green lamp.

Figure 10:
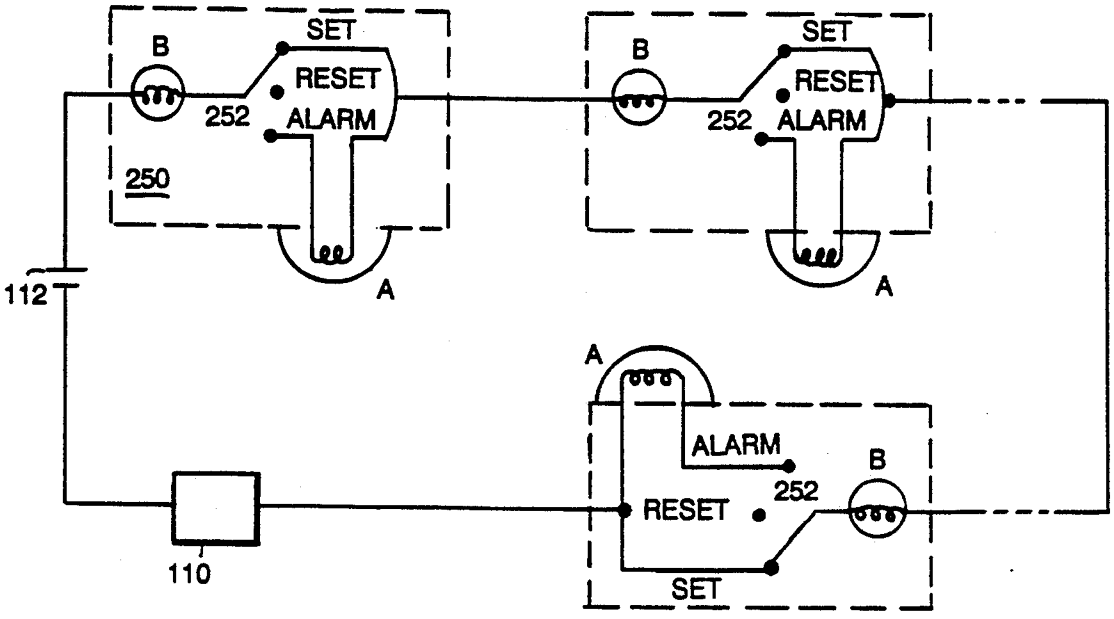
FIG. 10 is a circuit diagram of a mutual aid alarm system using a DC-driven reflexive circuit.

Referring to FIG. 10, in another application of the DC-powered reflex switch 110, a mutual-aid alarm system for a group of homes 250 includes a single reflex switch 110 wired in series with lamps B, three-way switches 252 and lamps A. Normally all switches 252 are kept in the SET position, so that reflex switch 110 is powered and all lamps B (located inside each house) are illuminated. A homeowner in need of aid throws his switch to alarm, which throws reflex switch 110 off, turning all lights B off, the signal that aid is needed. Any neighbor who notices his B light off can then reset the system by throwing his own switch 252 to RESET and then back to SET which resets reflex switch 110, causing all B lamps to be relighted. The A lamp lights on the house needing assistance. The A lamps are located to be visible to the neighbors to show which house needs aid.

Figure 11:
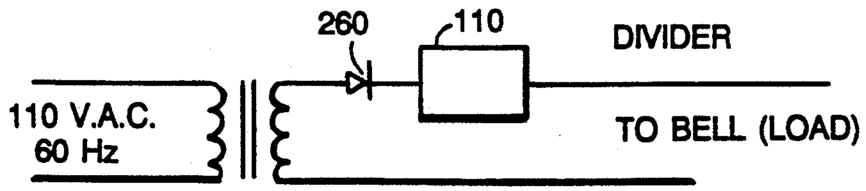
FIG. 11 is a telephone ringer circuit using an AC-driven reflexive circuit.

Referring to FIG. 11, another application for the AC-driven reflex switch 110, is to provide the 30 Hz signal required for telephone bell ringing based on a 110-volt AC 60 Hz source. In this application, reflex switch 110 serves as a frequency divider. Diode 260 rectifies the AC source so that only the positive half waves are passed at the rate of 60 Hz. Reflex switch 110 passes current every other time a pulse appears on its input, thus providing a 30 Hz output signal comprising every fourth half-wave of the AC source. The signal could be frequency divided again to 15 Hz by adding another reflex switch to the circuit.

In other important embodiments of the invention, the AC-driven reflex circuit is connected as a dimmer circuit for an incandescent lamp, by adding a diode in parallel with the reflex circuits, and using a conventional on-off switch so that whenever the switch is closed, half-wave current is delivered to the lamp to light it dimly. If the switch is opened temporarily and then closed again after a sufficiently short interruption the reflex circuit delivers the other half-wave current to the lamp, which causes to light the lamp at full brightness.

Figure 12:
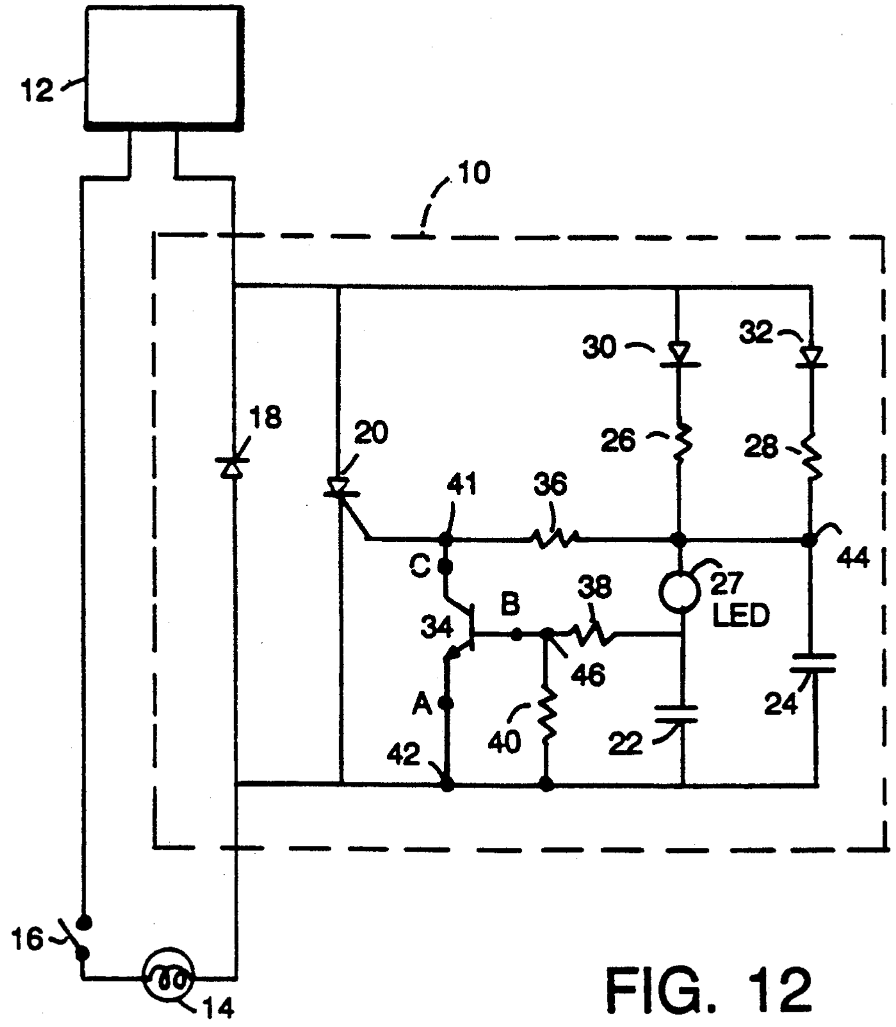
FIG. 12 is an AC-driven dimmer circuit using a silicon-controlled rectifier (SCR).

Referring to FIG. 12, reflex dimmer circuit 10 is inserted in one line of a conventional 110-volt AC lighting circuit having a power source 12, a lamp in the form of an incandescent light bulb 14 and an on-off switch 16, connected as shown. Dimmer circuit 10 is similar to the circuit of FIG. 5 except the full-wave bridge rectifier has been removed and a diode 18 has been added.

The dimmer circuit provides two paths for power to reach the bulb. One path, through a rectifier 18 is always connected and passes one half-wave of the AC current as long as the switch is on. The second path, through silicon controlled rectifier (SCR) 20, is either connected or disconnected depending upon the state of the other elements of the dimmer circuit. When rectifier 20 is conductive it passes the other half-wave of the AC current while the switch 16 is on. When only rectifier 18 (but not rectifier 20) is conductive, light bulb 12 is dimly illuminated by half-wave power. When both rectifiers 18, 20 are conductive, bulb 12 is brightly illuminated by full-wave power.

The silicon controlled rectifier 20 is controlled by circuitry consisting of a pair of capacitors 22, 24, respectively, connected in series with a pair of resistors 26, 28 and a pair of diodes 30, 32, as shown. Transistor 34 is connected with the resistors 36, 38 and 40 as shown. Light emitting diode (LED) 27 is wired in series with resistor 26.

In FIG. 12, the components of one embodiment have the following specifications:

| Component | |
|---|---|
| rectifier 18 | 400 volts PIV, 1 amp<br>1 amp |
| SCR 20 | 400 volts PIV |
| transistor 34 | Standard PIV 200 volts, hfe 100, power 1 watt |
| diode 30 | Small signal diode |
| diode 32 | Small signal diode |
| resistor 26 | 8.5 K ohm |
| resistor 28 | 2 K ohm |
| resistor 36 | 2 K ohm |
| resistor 38 | 1.3 K ohm |
| resistor 40 | 1.3 K ohm |
| capacitor 22 | 0.2 microfarads, 20 v. |
| capacitor 24 | 20 microfarads, 100 v. |

When switch 16 is first turned on, the light bulb is illuminated only dimly by half-wave AC power passed by rectifier 18. The silicon controlled rectifier 20 stays "off" (and does not pass the other half-wave) because current through diode 30 and resistors 26, 38 immediately turns on the transistor 34, establishing a current drain path between points 41 and 42. LED 27 is illuminated to indicate that the bulb is dimly illuminated and energy is being saved. The current drain path prevents any current through resistor 36 from triggering the SCR 20. Capacitor 22 quickly charges and keeps the transistor 34 on even during the half-waves when diode 30 is not passing any current through to the base of the transistor. Capacitor 24 also charges up (quickly, but less so than capacitor 22), establishing a voltage at point 44. As long as the switch remains on, the dimmer circuit remains stably in the described state and the light bulb is illuminated dimly.

When the switch is turned off, power to the light bulb and the dimmer circuit is cut off and capacitors 22, 24 begin to discharge, capacitor 22 discharging more quickly than capacitor 24. As the voltage at point 46 drops, transistor 34 quickly shuts off, establishing a high voltage at 41 (no longer shunted by the transistor) which puts the SCR 20 in a conductive state (although, because the switch 16 is off, current is not conducted). As capacitor 24 discharges, the voltage at 41 drops until, after a certain predetermined time interval passes, the SCR 20 is no longer in its conductive state and the dimmer circuit has effectively returned to its normal state before the switch was first turned on.

Thus, capacitor 24 serves as a "fading memory element", storing for the predetermined time interval the information that the switch 16 was recently on despite the fact that power to the circuit has been entirely switched off.

If the switch is not turned on again until after the predetermined time interval has passed, the light bulb will go on dim again, and continue to stay dim as described above. However, if the switch is turned on again before the time interval has passed, one half-wave of current will immediately pass through the SCR 20 which is in the conductive state (because capacitor 24 has not discharged). Since the other half-wave of current will still pass through rectifier 18, the two half-waves together will illuminate the light bulb brightly. (LED 27 is off, indicating that the bulb is burning brightly.) No other power is available through diode 30 to turn on the transistor 34 so the circuit remains stably in the described state (with the light bulb illuminated brightly) until switch 16 is turned off.

Modifications are readily possible to FIG. 12.

Figure 12A:
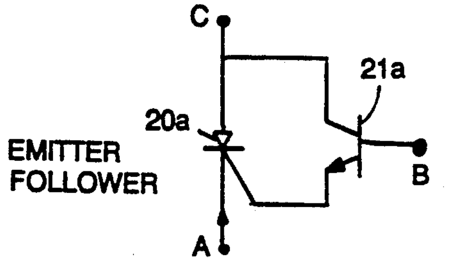
FIGS. 12A and 12B show SCR emitter follower and TRIAC versions of the circuit of FIG. 12.

For example, an emitter-follower configuration can be employed, which is shown in FIG. **12*a*. Here, SCR 20 is removed and the configuration of FIG. 12*a* is connected at corresponding points A, B and C of FIG. 12. The emitter of transistor 21*a* controls SCR 20*a* while the collector is connected across the SCR and the base is connected to point 46 in the circuit. The current at the base is multiplied by the Beta (typical value: 100) of the transistor, and appears thus amplified at the emitter. Due to this gain, the value of the capacitance required for capacitors 22 and 24 in this circuit (especially important, the value of power capacitor 24) are correspondingly reduced from that of FIG. 12**. This can save cost, reduce size and make possible the use of high temperature-resistant capacitors or the use of semiconductor chip technology.

Figure 12B:
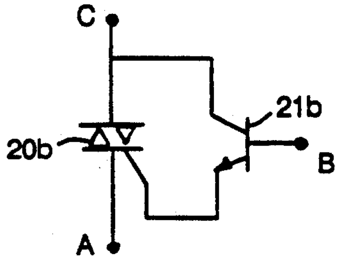

In FIG. 12b, another emitter-follower configuration, half of a triac 20b is controlled by transistor 21b with similar advantages. This enables use of triacs which are common in the light dimming industry.

Figure 13:
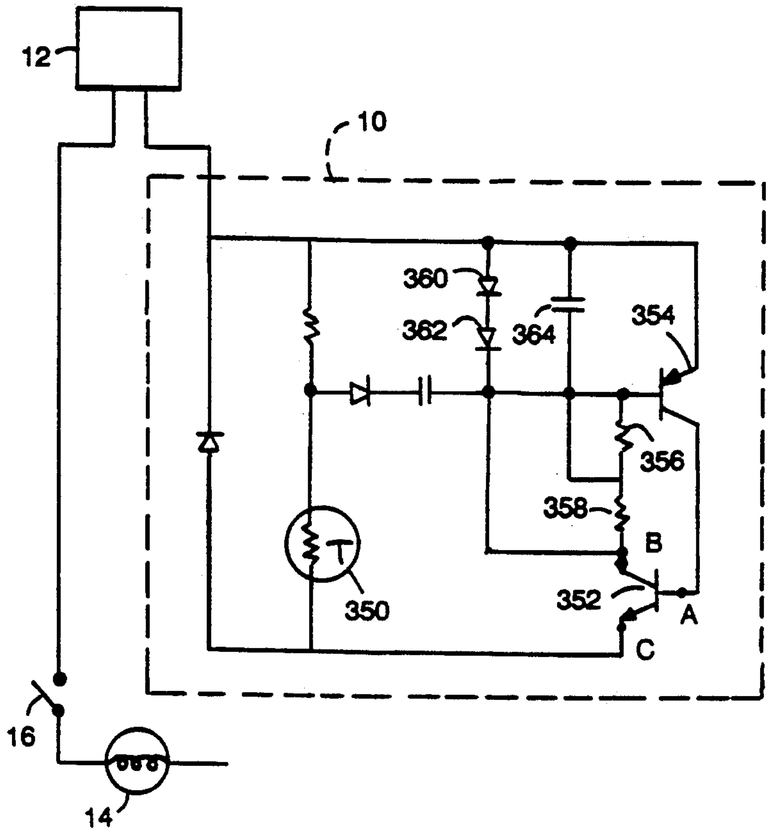
FIGS. 13 and 13A are circuit diagrams of other dimmer embodiments.

In FIG. 13, transistors 352, 354 form a negative resistance configuration such that a tiny current drawn by transistor 352 causes the circuit to become fully saturated, so the circuit is either fully on or fully off. Resistors 356, 358 protect transistor 354 by reducing the current flow from transistor 352 to the base of transistor 354, with the rest of the current flow shunted through diodes 360, 362. Capacitor 364 keeps a sufficient voltage across transistor 354 to keep the circuit saturated even during the "off" half-cycles of AC current.

When the circuit is first turned on, thermistor 350 is cold and there is insufficient current to trigger Q1. After thermistor 350 warms up, if the lamp is turned off and back on the lower resistance of warm thermistor 350 causes current through capacitor 366 to switch on transistor 354.

During the bright phase, thermistor 350 cools down, i.e. the fading memory element resets to its original state. Thus, unlike FIG. 12, the circuit can be switched back on to dim, after being on bright for awhile, with no prolonged waiting interval. PNP transistor 352 receives the full line voltage.

Figure 13A:
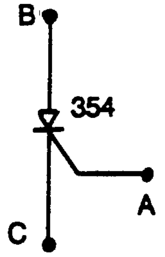

FIG. 13a illustrates an SCR 354 that can be substituted for the transistor of FIG. 13 by connection of the respective terminals A, B and C.

Figure 14:
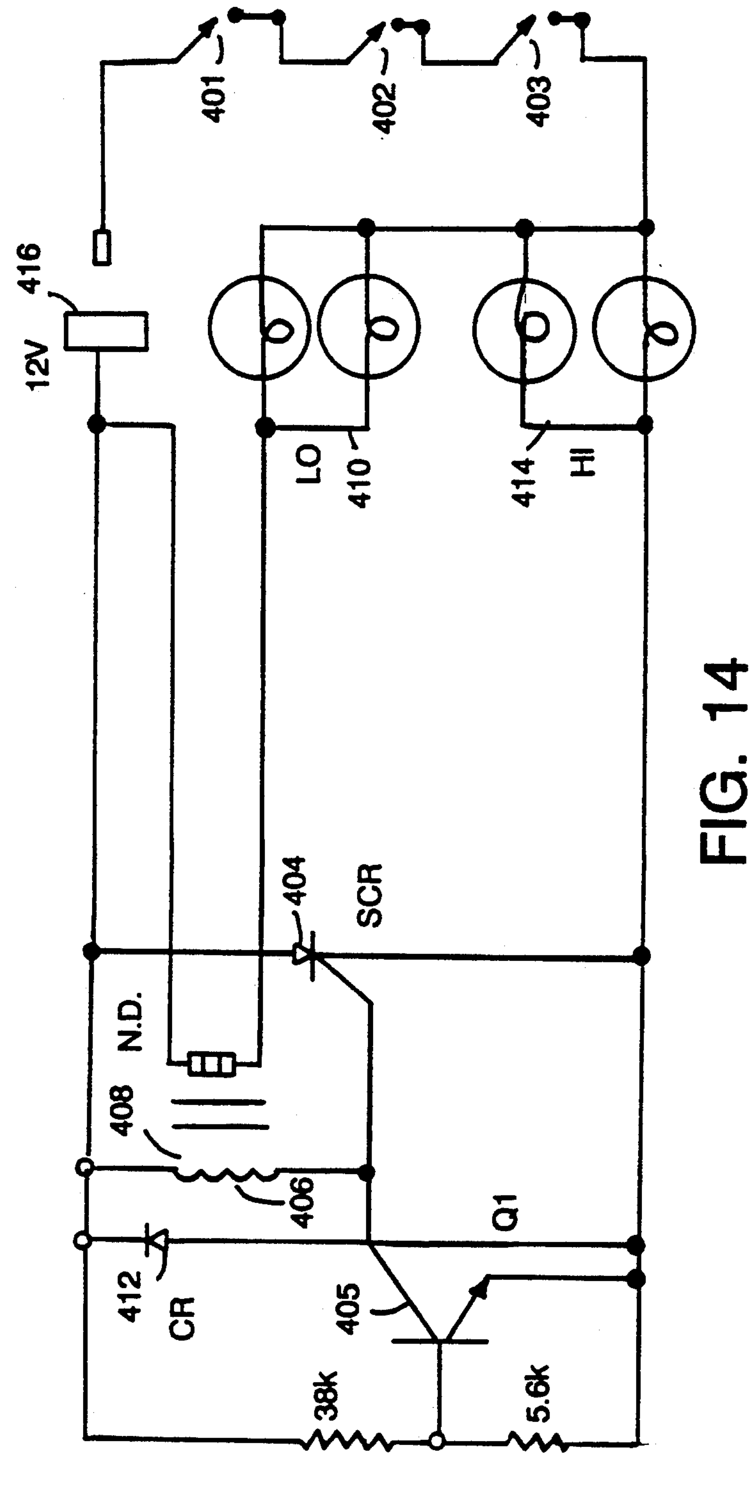
FIG. 14 illustrates a further embodiment of a circuit in accordance with the present invention utilizing an inductor as the energy storage component.
Figure 1:
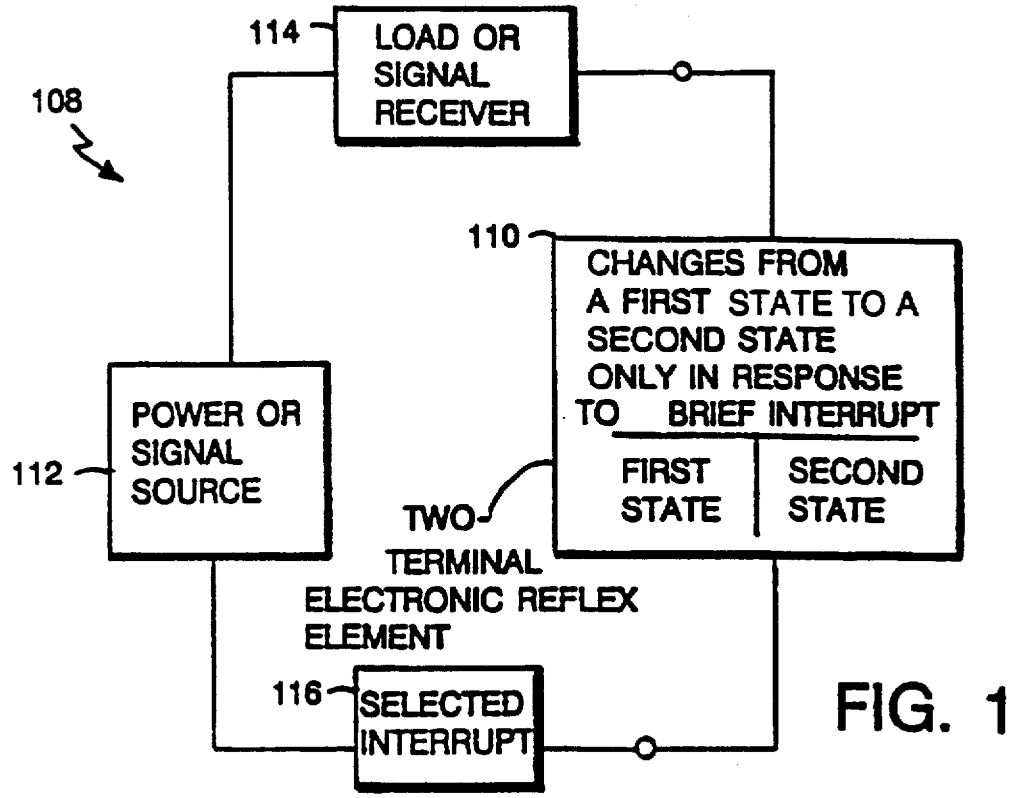
Figure 2:
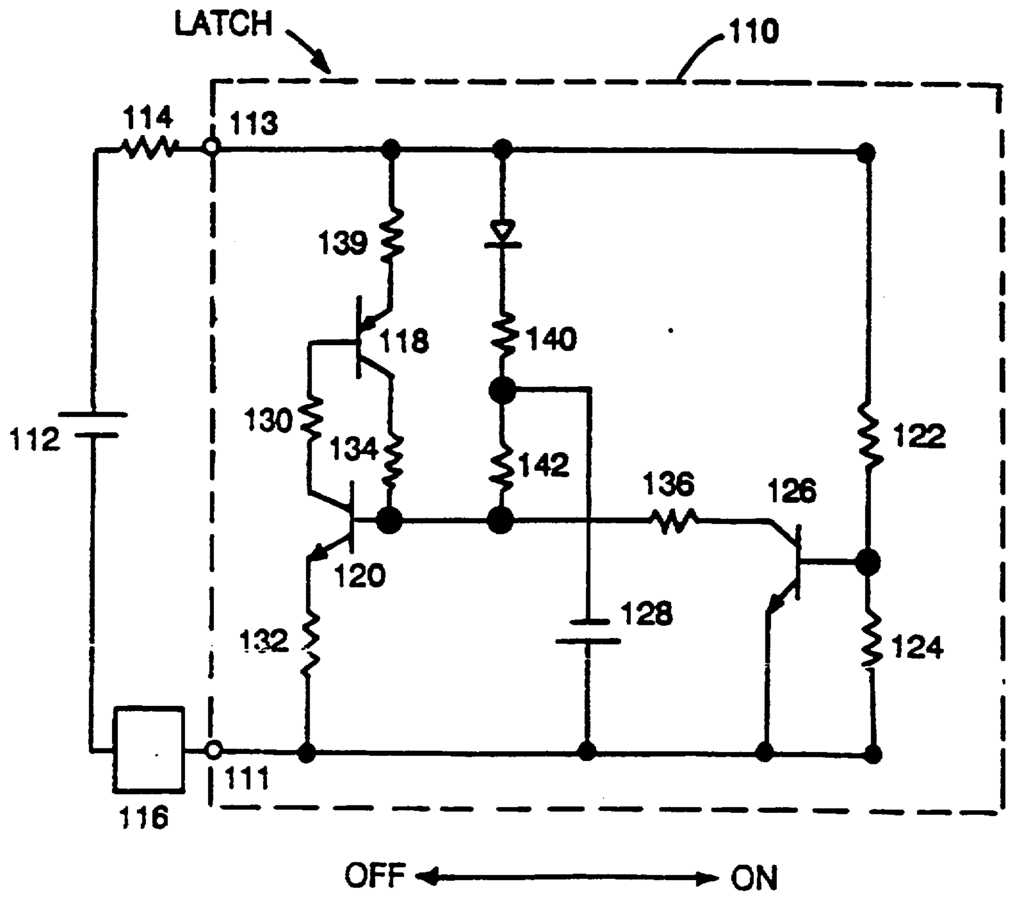
Figure 3:
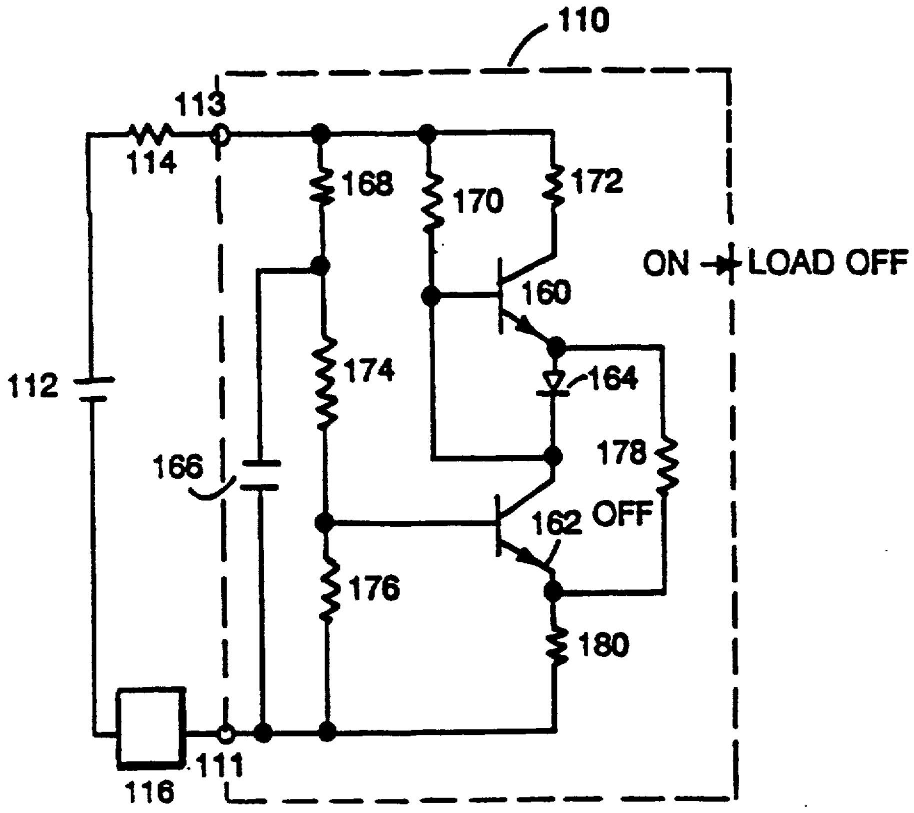
Figure 4:
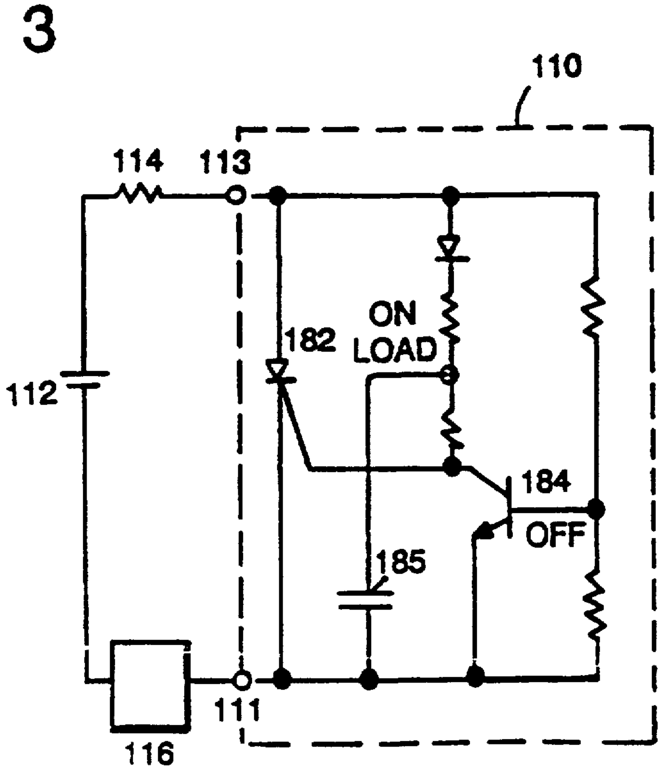
Figure 5:
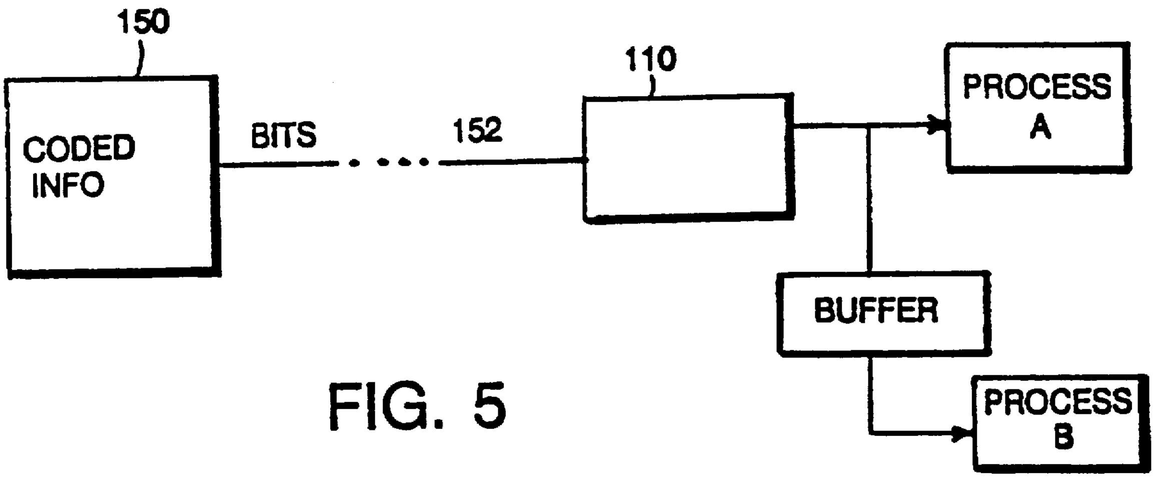
Figure 6:
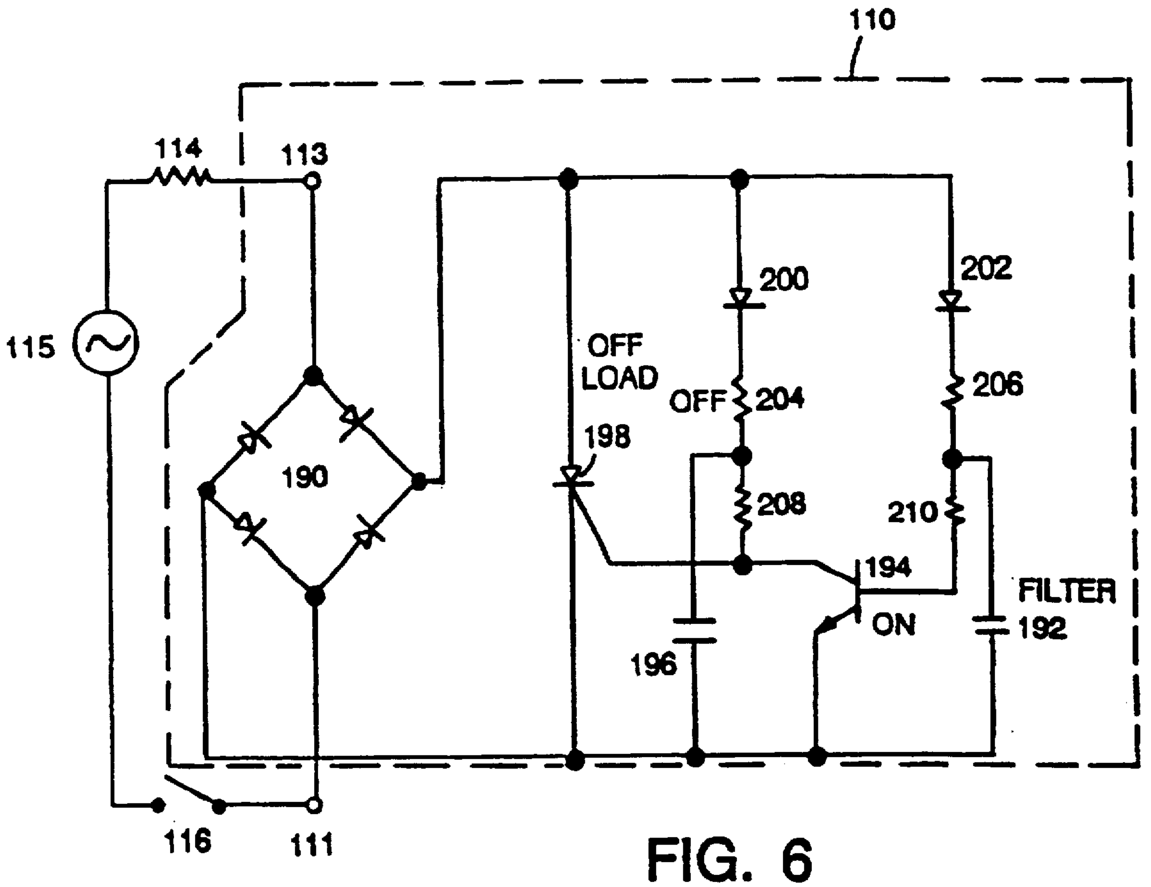
Figure 7:
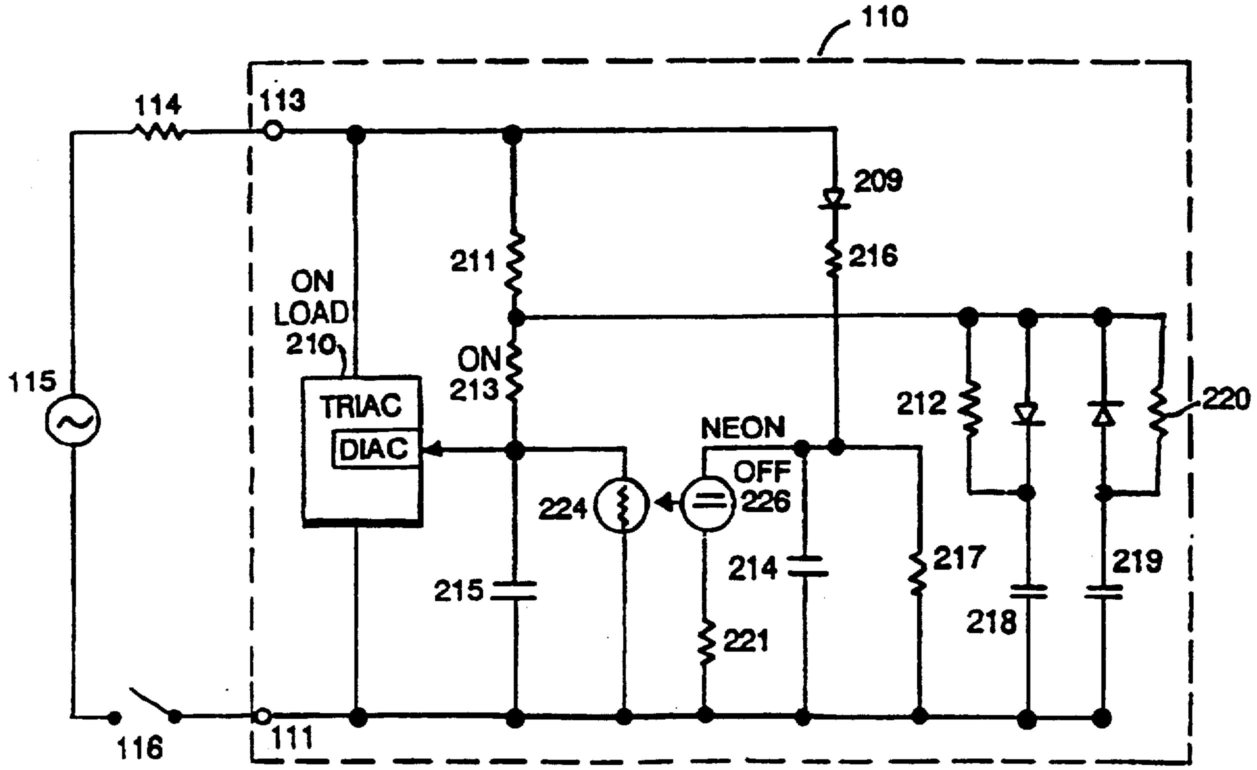
Figure 8:
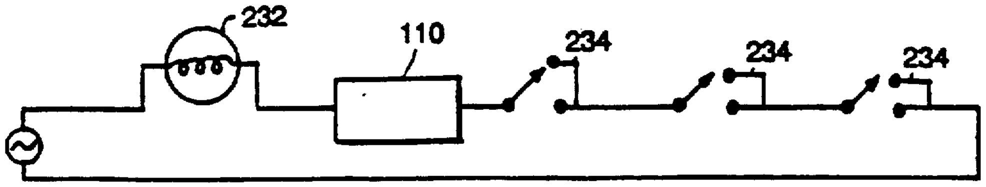
Figure 9:
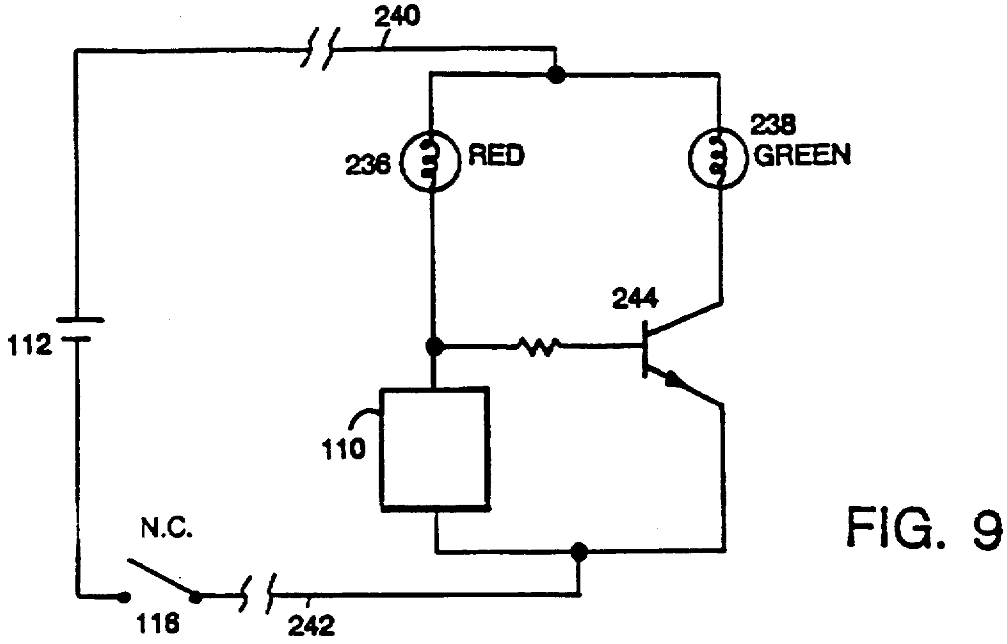
Figure 10:
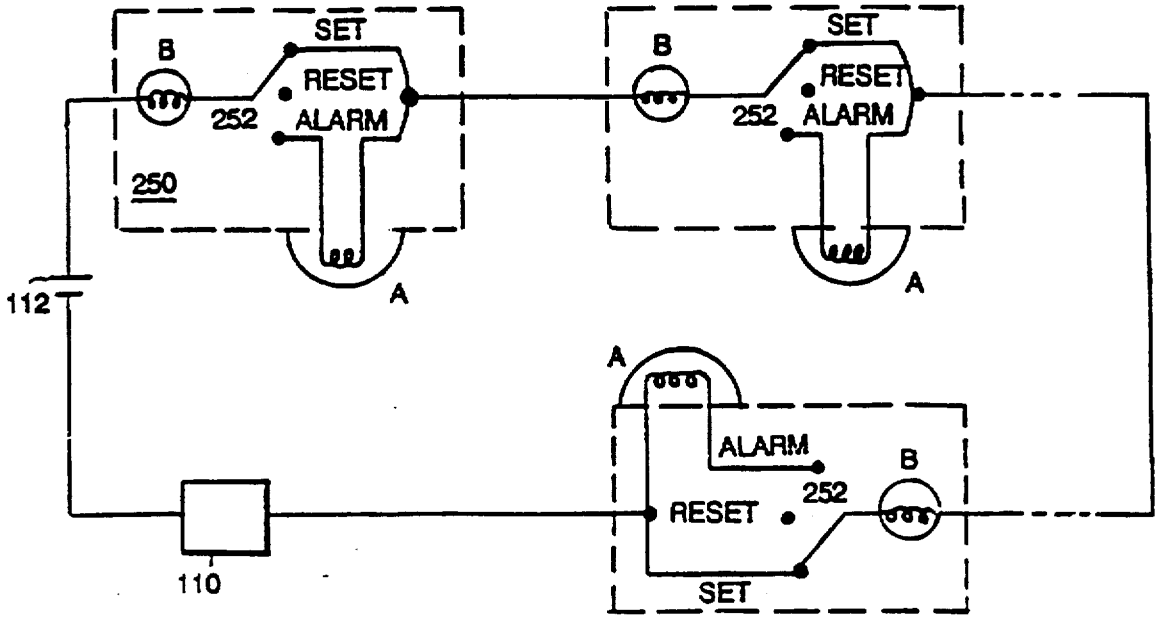
Figure 11:
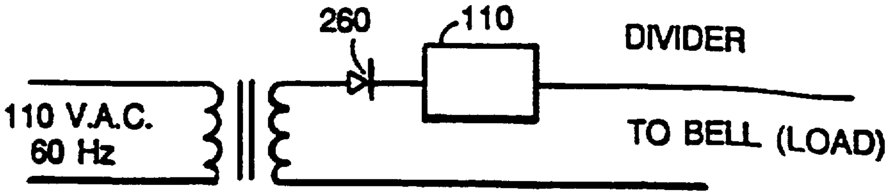
Figure 12:
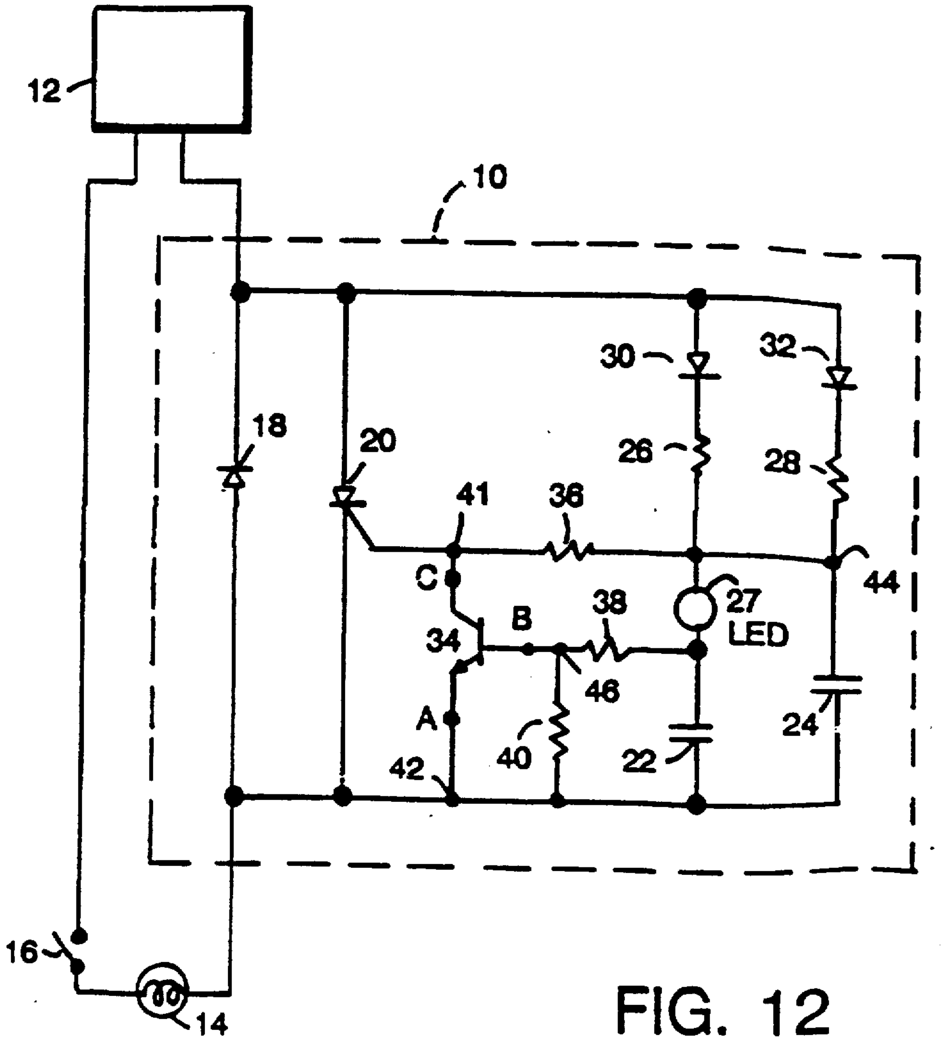
Figure 12A:
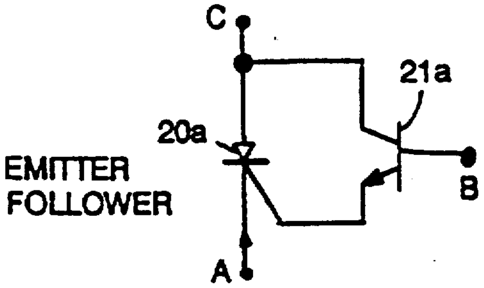
Figure 12B:
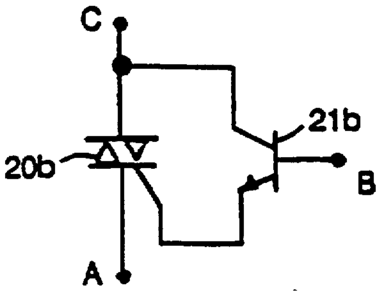
Figure 13:
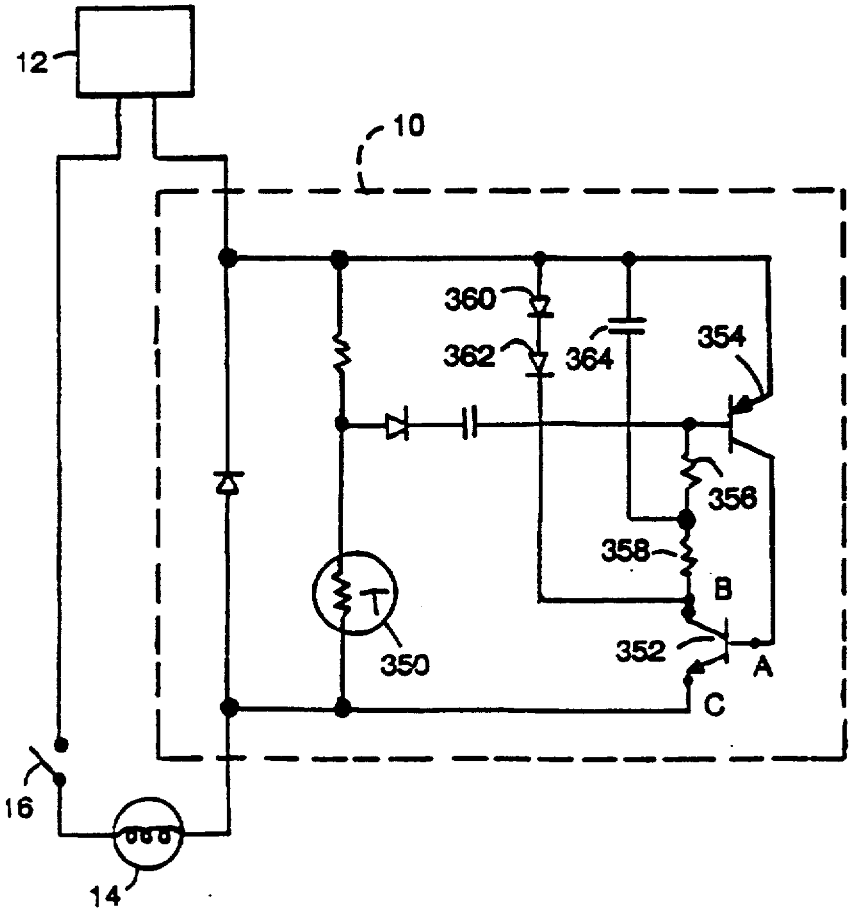
Figure 13A:
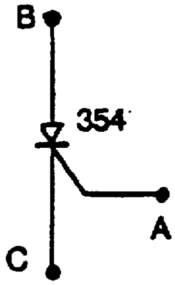
Figure 14:
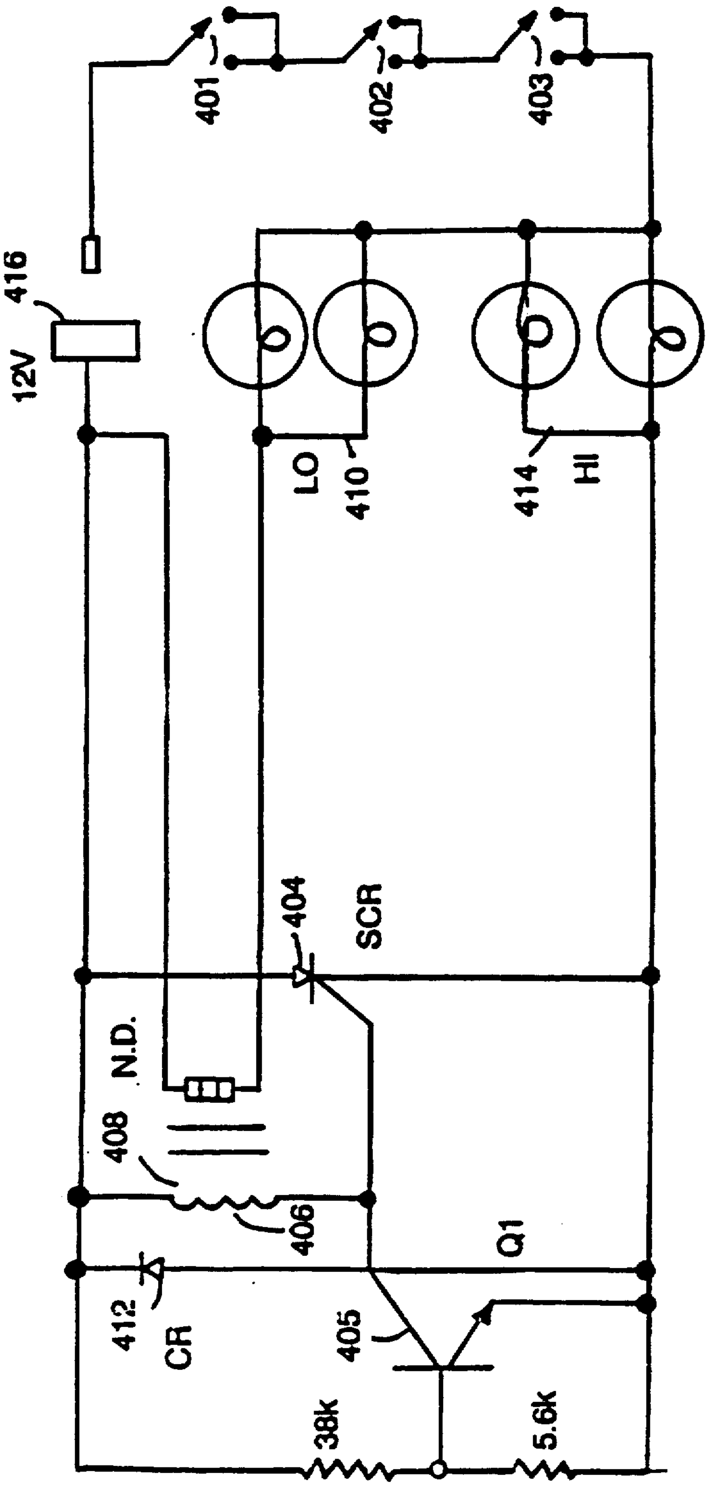

FIG. 14 is a schematic diagram of a multivibrator circuit using an inductor in lieu of a capacitor. The circuit of FIG. 14 is intended to provide slow switching, as for example, high/low switching for automobile headlights. The switching stations 401, 402 and 403, shown at the extreme right of the circuit, are SPDT toggle switches with two throws tied together so that dead time during the throw generates the pulse necessary to change the state of the device. When the device is first turned on, the SCR 404 cannot fire because transistor 405 prevents the flow of the gate current which has been delayed by the inductance 406 of the relay generally designated as reference numeral 408. This relay is normally open. Accordingly, the device is in the state shown as illustrated in which the relay 408 is activated by transistor 405, the contacts are closed, and the low beams 410 are fired. If one of the toggle switches is flipped, the pulse generated thereby turns off transistor 405. The fly-back current in the relay 408 discharges through a diode 412 and the SCR gate, so that when the pulse ends and voltage is reinstated, the SCR has already fired and the collector of transistor 405 cannot compete for SCR gate current. Since the SCR has fired, the voltage between its cathode and anode is low. Accordingly, the relay is open, thereby extinguishing the low lamps and the current through the SCR turns on the high lamps 414. The circuit illustrated in FIG. 14 includes a D.C. power source such as battery 416.

As illustrated by FIG. 14, an inductor may be used in a reflex circuit in lieu of the capacitor disclosed in the earlier discussed embodiments of the invention. Use of an inductor is advantageous in many respects. Inductors provide a more stable delay and more stable storage of energy than capacitors in multi-vibrator circuits. Moreover, the use of inductors in lieu of capacitors eliminates the potential problem of stray capacitance in circuits, particularly circuits including semi-conductor devices.

In addition to the advantages already noted, inductors may be used when the supply voltage approaches that of junctions, as for example 2 volts. Moreover, use of inductors in extremely high speed switching may be more economical than the use of a capacitor because the inductors are smaller and less expensive. Inductors are generally more durable than capacitors and thus are more desirable in circuits where heat or extreme cold may be encountered. Additionally, as illustrated by the embodiment of FIG. 14 discussed above, use of an inductor in the multi-vibrator circuit of the present invention is advantageous because the inductor itself may serve two separate functions. First, the inductor functions as the energy storage component which affects a change in the state of the circuit as a result of interruptions to the circuit. Second, the inductor itself may function as a relay as described in the FIG. 14 embodiment.

I claim:

1. A two-terminal device for connection by its two terminals into an electrical circuit having a power source or signal connected to an electrical load or signal receiver and a means for causing selected brief interruptions of the circuit, comprising:
   - a bi-stable circuit comprising two electrical valves, said circuit connected to receive power or a signal from said source via said two terminals and to change from a first state to a second state in response to said interruptions, said state change being dependent on the brevity of said interrutpions, an opposite one of said valves being in its conductive state in each of said electrical states, said valves being coupled to each other such that current conducted through one of said valves prevents conduction by the other of said valves,
   - one of said valves connected to permit no more than a low level of current or signal to reach the load or the signal receiver through said valve, when the bi-stable circuit is in a particular one of the states and the electrical circuit is not being interrupted,
   - the other of said valves connected to conduct power to said load or to deliver a signal to said signal receiver when the bi-stable circuit is in its other state, said power being only either DC power or integral half-cycles or full-cycles of AC power, and
   - energy storage means coupled to another of said valves that is adapted to transmit power or signals to said load, said energy storage means directly causing that valve to conduct in response to a circuit interruption signal when said bi-stable circuit is in said state which prevents said power or said signal from reaching said load.

2. A two-terminal device for connection by its two terminals into an electrical circuit having a power source or signal connected to an electrical load or signal receiver and a means for causing selected brief interruptions of the connection between the source and the load or signal receiver, comprising:
   - a bi-stable circuit comprising two electrical valves, said circuit connected to receive power or a signal from said source via said two terminals and to respond to each said interruption by changing from the electrical state it occupied before the interruption to its other electrical state, an opposite one of said valves being in its conductive state in each of said electrical states, said valves being coupled to each other such that current conducted through one of said valves prevents conduction by the other of said valves, said bi-stable circuit further comprising a control element connected to enable power or a signal from the source to reach the load or signal receiver through one of said valves when the bi-stable circuit is in one state and the electrical circuit is not being interrupted, or to permit no more than a low level of current or signal to reach the load when the bi-stable circuit is in the other state and the circuit is not being interrupted, said control element including energy storage means coupled to said valve that is adapted to transmit power or signals to said load, said energy storage means directly causing that valve to conduct power to said load, said power being only either DC power or integral half-cycles or full-cycles of AC power, in response to a circuit interruption signal when said bi-stable circuit is in said state which prevents said power or said signal from reaching said load.

3. A two-terminal high speed logic circuit element for computers comprising:

a first terminal for receiving input binary signals, a second terminal for delivering output binary signals, said binary signals being represented by either a non-zero DC voltage level or an effectively zero level, and a two-state element whose state depends upon the effectively zero level signals appearing at said input terminal, said two-state element including a control element which permits no more than a low level, effectively zero output signal when said two-state element is in one state and only a non-zero DC level output signal when said two-state element is in said other state.

4. A two-terminal device for connection by its two terminals into an electrical circuit having a DC power source connected to an electrical load and an "on, off" switch for selectively and briefly interrupting the connection between the source and the load, comprising:

a bi-stable circuit comprising two electrical valves, said circuit connected to receive power from said source via said two terminals and to respond to each said interruption by changing from the electrical state it occupied before the interruption to its other electrical state, an opposite one of said valves being in its conductive state in each of said electrical states, said bi-stable circuit further comprising a control element capable of responding to interruptions no shorter than about one millisecond to enable the DC power from the source to reach the load through one of said valves when the bi-stable circuit is in one state, or to permit no more than a low level of current or signal to reach the load when the bi-stable circuit is in the other state and the electrical circuit is not being interrupted.

5. A two-terminal device for connection by its two terminals into an electrical circuit having an AC power source connected to an electrical load and an "on, off" switch for selectively and briefly interrupting the connection between the source and the load, comprising:

a bi-stable circuit comprising two electrical valves, said circuit connected to receive power from said source via said two terminals and to respond to each said interruption by changing from the electrical state it occupied before the interruption to its other electrical state, an opposite one of said valves being in its conductive state in each of said electrical states, said bi-stable circuit further comprising a control element capable of responding to interruptions no shorter than about one millisecond to enable only full-wave or half-wave AC power from the source to reach the load when the bi-stable circuit is in one state, or to permit no more than a low level of current or signal to reach the load when the bi-stable circuit is in the other state and the electrical circuit is not being interrupted.

6. The device of claim 1 wherein said source supplies direct current.

7. The device of claim 2 wherein said means for causing brief interruptions comprises logic circuitry for delivering a succession of logical signals to said bi-stable circuit, some of said signals being at a zero voltage level, and wherein said load comprises logic circuitry for receiving logical signals from said bi-stable circuit.

8. The device of claim 2 wherein said two-state element bi-stable circuit further comprises a fading memory electrical component whose condition determines the state of the bi-stable circuit, said fading memory component being arranged to be in a first condition when said voltage is being prevented from reaching the load, and to fade from said first condition to a second condition in a predetermined period of time during the next interruption, whereby if said next interruption is shorter than said predetermined period, power is enabled to reach the load after said next interruption ends.

9. The device of claim 8 wherein said fading memory component comprises a capacitor.

10. The device of claim 1 wherein said a pair of electrical valves are connected in a positive-feedback configuration.

11. The device of claim 2 wherein said one of said valves is a silicon-controlled rectifier.

12. The device of claim 2 wherein said source supplies alternating current.

13. The device of claim 12 wherein said device further comprises a full-wave bridge rectifier connected between said electrical circuit and said bi-stable circuit, whereby full-wave power is enabled to reach the load.

14. The device of claim 1 wherein said energy storage means is a capacitor.

15. The device of claim 2 wherein said energy storage means is a capacitor.

16. The device of claim 1 wherein said energy storage means is an inductor.

17. The device of claim 2 wherein said energy storage means is an inductor.

18. The device of claim 16 wherein said inductor is part of a relay.

* * * * *

UNITED STATES PATENT AND TRADEMARK OFFICE

CERTIFICATE OF CORRECTION

PATENT NO. : 5,294,849

DATED : March 15, 1994

INVENTOR(S) : Bronson Potter

It is certified that error appears in the above-identified patent and that said Letters Patent is hereby corrected as shown below:

Column 7, line 58, right side of column, delete "1 amp".

In the Drawings:

Please replace existing Figures 1 - 14 with the attached corrected versions (Figures 1 - 14).

The title page should be deleted to replaced with per attached title page.

Signed and Sealed this

Eighteenth Day of April, 1995

Attest:

Bruce Lehman

BRUCE LEHMAN

Attesting Officer

*Commissioner of Patents and Trademarks*

United States Patent [19]

Potter

[11] Patent Number: 5,294,849

[45] Date of Patent: Mar. 15, 1994

[54] REFLEXIVE CIRCUIT

[76] Inventor: Bronson Potter, R.F.D. 1, Greenville, N.H. 03048

[21] Appl. No.: 873,649

[22] Filed: Apr. 23, 1992

Related U.S. Application Data

[63] Continuation of Ser. No. 762,070, Sep. 18, 1991, abandoned, which is a continuation of Ser. No. 789,631, Oct. 21, 1985, abandoned, which is a continuation-in-part of Ser. No. 550,293, Nov. 9, 1983, abandoned, which is a continuation-in-part of Ser. No. 470,913, Mar. 1, 1983, abandoned, which is a continuation-in-part of Ser. No. 372,978, Apr. 29, 1982, abandoned.

[51] Int. Cl.[5] .......... H03K 17/13; H03K 17/51

[52] U.S. Cl. .......... 307/647; 307/639; 307/643; 307/632

[58] Field of Search .......... 315/DIG. 4, 194, DIG. 5, 315/199, 209, 205, 206, 207, 306, 66, 73, 156, 705, 291, 360; 307/146, 141, 140, 253, 254, 632, 639, 647, 643, 642, 638; 361/58, 18, 56, 57

[56] References Cited

U.S. PATENT DOCUMENTS

| | | | |
|---|---|---|---|
| 2,776,420 | 1/1957 | Woll | 340/252 |
| 2,863,692 | 12/1960 | Barter et al. | 340/251 |
| 3,061,744 | 10/1962 | Spira | 307/146 |
| 3,227,920 | 1/1966 | Peek, Jr. et al. | 315/66 |
| 3,234,342 | 2/1966 | Murray | 200/51 |
| 3,517,211 | 6/1970 | Firth | 307/225 |
| 3,558,912 | 1/1971 | Spall | 315/306 |
| 3,619,658 | 11/1971 | Prunty | 307/255 |
| 3,665,212 | 5/1972 | Roberts et al. | 307/647 |
| 3,721,832 | 3/1973 | Lee | 307/141 |
| 3,733,528 | 5/1973 | Gilbreath | 315/291 |
| 3,870,903 | 3/1975 | Taylor | 307/252 |
| 3,898,516 | 8/1975 | Nakasone | 315/194 |
| 3,916,249 | 10/1975 | Ackerman | 315/73 |
| 3,935,482 | 1/1976 | Fox, Jr. et al. | 307/647 |
| 3,940,660 | 2/1976 | Edwards | 315/360 |
| 3,991,343 | 11/1976 | Delpy | 315/194 |
| 4,082,961 | 4/1978 | Genuit | 315/194 |
| 4,087,702 | 5/1978 | Kirby et al. | 307/252 |
| 4,090,107 | 5/1978 | Seib | 315/156 |
| 4,097,782 | 6/1978 | Chambliss | 315/194 |
| 4,144,478 | 3/1979 | Nuver | 315/291 |
| 4,152,608 | 5/1979 | Nakasone et al. | 315/194 |
| 4,155,015 | 5/1979 | Nakasone et al. | 307/252 |
| 4,158,150 | 6/1979 | Dever | 307/647 |
| 4,160,192 | 7/1979 | McAllise | 315/194 |
| 4,245,166 | 1/1981 | Rankin | 307/632 |
| 4,249,089 | 2/1981 | Wolford et al. | 307/140 |
| 4,274,034 | 6/1981 | Conklin | 315/240 |
| 4,350,903 | 9/1982 | Uimerson et al. | 315/194 |
| 4,358,716 | 11/1982 | Cordes et al. | 315/306 |
| 4,371,812 | 2/1983 | Widmayer | 315/205 |

FOREIGN PATENT DOCUMENTS

| | | |
|---|---|---|
| 0053896 | 6/1982 | European Pat. Off. . |
| 0093408 | 11/1983 | European Pat. Off. . |

*Primary Examiner*—William L. Sikes
*Assistant Examiner*—Toan Tran
*Attorney, Agent, or Firm*—Fish & Richardson

[57] ABSTRACT

A two-terminal device for connection by its two terminals into an electrical circuit having a power source or signal connected to an electrical load or signal receiver and a means for causing selected brief interruptions of the circuit, comprising an electronic reflex element connected to receive power or a signal from the source via the two terminals and to change from a first state to a second state in response to the interruptions, the state change being dependent on the brevity of the interruptions, the reflex element including a control element connected to prevent power or a signal from reaching the load or signal receiver when the reflex element is in a particular one of the states and the circuit is not being interrupted.

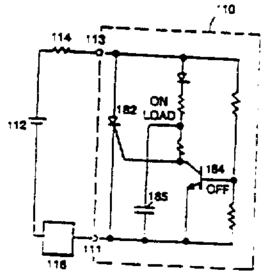

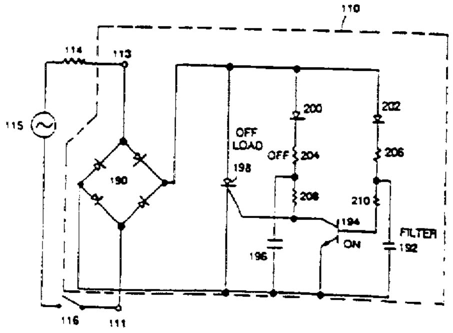

18 Claims, 8 Drawing Sheets